US012721142B2

(12) United States Patent
Motoyama et al.

(10) Patent No.: US 12,721,142 B2
(45) Date of Patent: Aug. 25, 2026

(54) ISOLATED SUPER VIA TO MIDDLE METAL LINE LEVEL

(71) Applicant: International Business Machines Corporation, Armonk, NY (US)

(72) Inventors: Koichi Motoyama, Clifton Park, NY (US); Ruilong Xie, Niskayuna, NY (US); Nicholas Anthony Lanzillo, Wynantskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 392 days.

(21) Appl. No.: 18/060,168

(22) Filed: Nov. 30, 2022

(65) Prior Publication Data

US 2024/0178127 A1 May 30, 2024

(51) Int. Cl.
*H10W 20/42* (2026.01)
*H10W 20/00* (2026.01)
*H10W 20/41* (2026.01)

(52) U.S. Cl.
CPC ......... *H10W 20/42* (2026.01); *H10W 20/056* (2026.01); *H10W 20/064* (2026.01); *H10W 20/082* (2026.01); *H10W 20/435* (2026.01)

(58) Field of Classification Search
None
See application file for complete search history.

(56) References Cited

U.S. PATENT DOCUMENTS

| | | | | |
|---|---|---|---|---|
| 9,805,972 | B1 | 10/2017 | Zhang et al. | |
| 9,911,651 | B1 | 3/2018 | Briggs et al. | |
| 10,020,254 | B1 | 7/2018 | Bao et al. | |
| 10,026,687 | B1 | 7/2018 | Lin et al. | |
| 10,109,526 | B1 | 10/2018 | Zhang et al. | |
| 10,522,403 | B2 | 12/2019 | Stephens et al. | |
| 11,133,260 | B2 | 9/2021 | Liu et al. | |
| 2018/0114752 | A1* | 4/2018 | Briggs | H01L 23/528 |
| 2021/0202639 | A1* | 7/2021 | Tsubuku | H10D 30/6739 |
| 2021/0375637 | A1 | 12/2021 | Parikh | |
| 2024/0153864 | A1* | 5/2024 | Motoyama | H10W 20/089 |
| 2024/0170404 | A1* | 5/2024 | Lanzillo | H10W 20/20 |

* cited by examiner

*Primary Examiner* — Nduka E Ojeh
(74) *Attorney, Agent, or Firm* — Amin, Turocy & Watson, LLP

(57) ABSTRACT

One or more systems, devices, and/or methods of fabrication provided herein relate to isolated self-aligned super vias. According to one embodiment, a super via device can comprise a super via structure, a metallic line and a dielectric fill material located between the sidewalls of the super via structure and the metallic line.

17 Claims, 18 Drawing Sheets

ISOLATED SUPER VIA TO MIDDLE METAL LINE LEVEL

BACKGROUND

The subject disclosure relates to isolated super vias, and more specifically to self-aligned dielectric fill between the sidewalls of super vias and adjacent metallic lines.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a super via device can comprise a super via structure, a metallic line, and a dielectric fill material located between the sidewalls of the super via structure and the metallic line, wherein the dielectric fill material insulates the super via from the metallic line.

According to another embodiment, a method for fabricating a super via device, by a fabrication system, can comprise forming, by the fabrication system, a wafer comprising a metallic line, patterning, by the fabrication system, a channel through the metallic line, filling, by the fabrication system, the channel with a dielectric fill material, patterning, by the fabrication system, a second channel through the dielectric fill material, and forming, by the fabrication system, a super via structure in the second channel.

According to another embodiment, a method for fabricating a super via device, by a fabrication system, can comprise, forming, by the fabrication system, a wafer comprising a metallic line, etching, by the fabrication system, a first portion of a first channel from a top layer of the wafer to the metallic line, etching, by the fabrication system, a second portion of the first channel through the metallic line, wherein the second portion of the first channel comprises a width greater than the first portion of the first channel, filling, by the fabrication system, the first channel with a dielectric fill material, etching, by the fabrication system, a second channel through the dielectric fill material, wherein the second channel comprises a width less than the width of the second portion of the first channel, and forming, by the fabrication system, a super via structure in the second channel.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Super vias, also known as skip vias, are currently being pursed as part of semiconductor design due to superior performance when compared to stacked via designs. For example, a stacked via design comprising a first via stacked on a metallic island coupled to a second via can create resistances that account for up to 3% of total delays within the semiconductor device. Furthermore, the elimination of the metallic island can allow for an increase in signal wiring within a given area, improving semiconductor device performance.

However, existing super via designs are susceptible structural issues that impact performance. For example, due to the high aspect ratios of super vias (e.g., height is greater relative to width), super vias are prone to bowing, wherein the middle of the super via bows outward. This bowing can decrease the distance between the super via and adjacent metallic lines, which can cause shorts between the adjacent metallic lines and the super via, leading to decreased semiconductor device performance. Furthermore, when the metal pitch (e.g., the distance between contacts in a level of wiring) shrinks, the distance between super vias and adjacent metallic lines can further shrink, increasing short risk.

Figure 1:
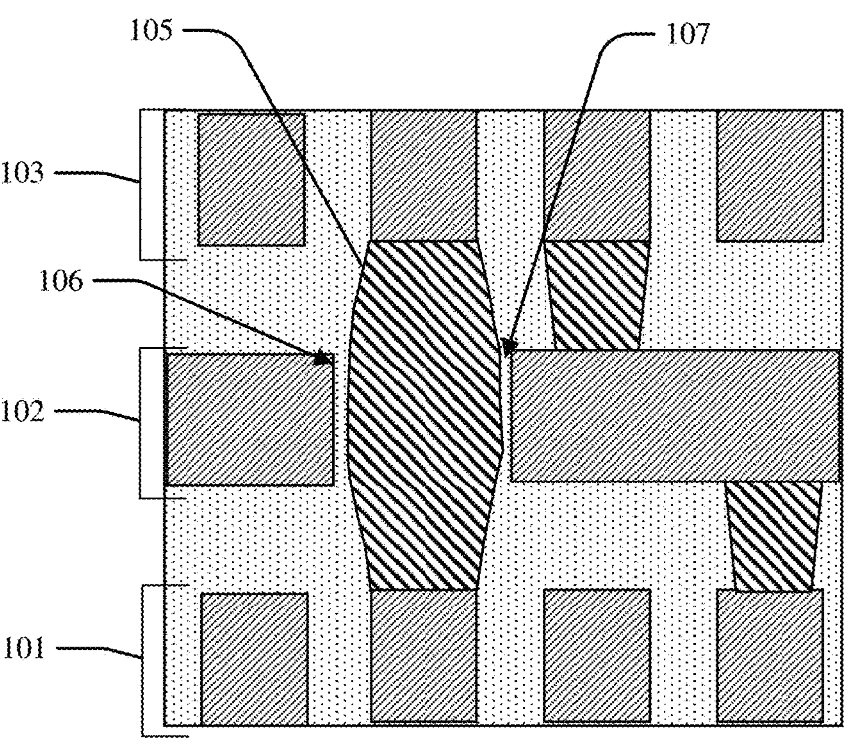
FIG. 1 illustrates an example semiconductor device exhibiting bowing of a super via in accordance with one or more embodiments described herein.

FIG. 1 illustrates an example semiconductor device 100 exhibiting bowing of a super via in accordance with one or more embodiments described herein.

Device 100 as shown, comprises a first level of wiring 101, a second level of wiring 102 and a third level of wiring 103. Furthermore, super via 105 connects the first level of wiring 101 to the third level of wiring 103. As shown, super via 105 exhibits bowing at points 106 and 107. Due to this bowing, super via 105 is vulnerable to shorts and decreased performance.

Figure 2:
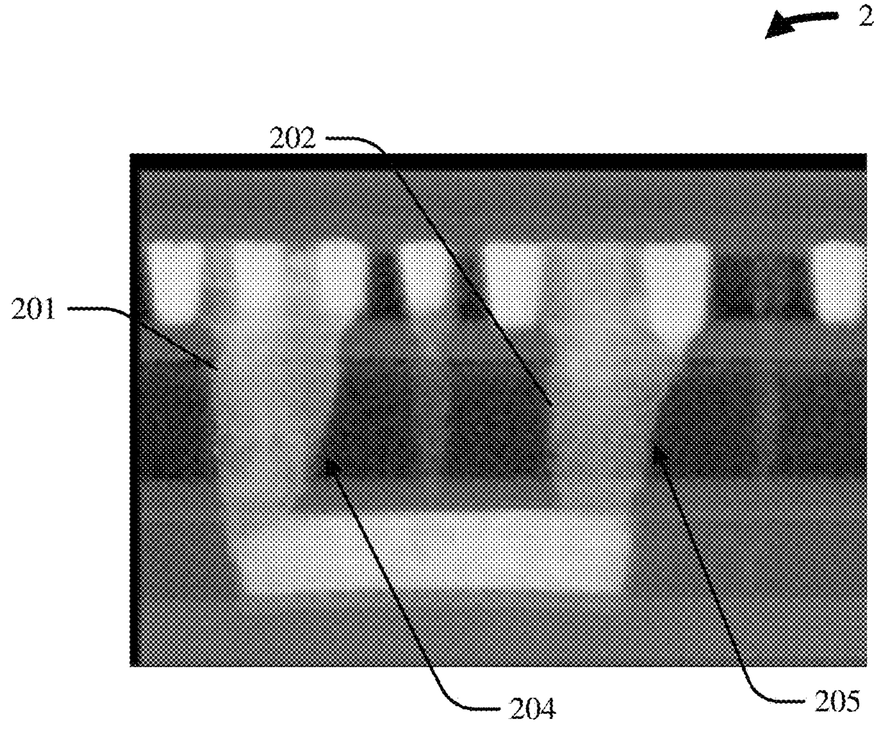
FIG. 2 illustrates an example of a semiconductor device 200 suffering from blowout in accordance with one or more embodiments described herein.

FIG. 2 illustrates an example of a semiconductor device 200 suffering from blowout in accordance with one or more embodiments described herein. As shown by points 201 and 202, super vias 204 and 205 are suffering from deformation due to the chemistry of the etching process utilized to form device 200. Accordingly, super vias 204 and 205 are deformed.

Figure 3:
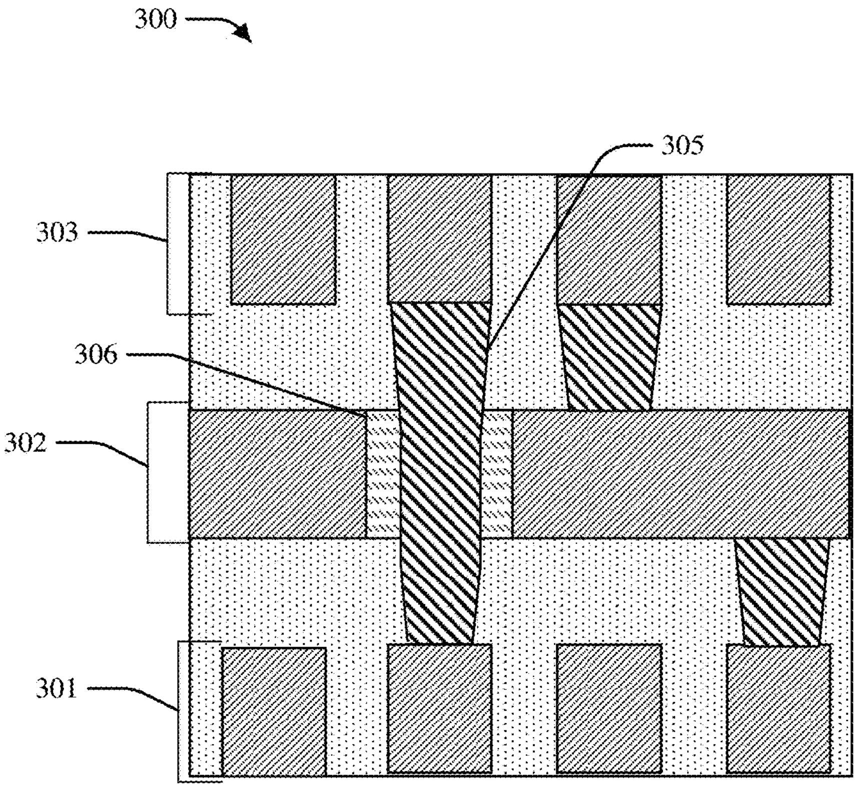
FIG. 3 illustrates an example, non-limiting semiconductor device with self-aligned dielectric fill in accordance with one or more embodiments described herein.

FIG. 3 illustrates an example, non-limiting semiconductor device 300 with self-aligned dielectric fill in accordance with one or more embodiments described herein.

Device 300 as shown comprises a first level of wiring 301, a second level of wiring 302 and a third level of wiring 303. Furthermore, super via 305 connects the first level of wiring 301 to the third level of wiring 303. In an embodiment, super via 305 can comprise at least one of Cu, Co, Ru, W, Rh or Jr, or another suitable material. As shown, device 300 comprises dielectric fill material 306 between super via 305 and the adjacent metallic lines of the second level of wiring 302. In an embodiment, dielectric fill material 306 can comprise a high-k material (e.g., materials with a dielectric constant higher than the dielectric constant of silicon dioxide). Examples materials include but are not limited to aluminum oxides, silicon nitrides, hafnium oxides, or other high-k dielectric materials. Due to the dielectric nature of fill material 306, super via 305 is insulated from adjacent metallic lines in the second level of wiring 302, and thus protected from shorts. Furthermore, as described in greater detail below, in some embodiments, dielectric fill material 306 can be formed prior to super via 305, thereby preventing bowing of super via 305. In some embodiments, two or more dielectric fill materials can be utilized. For example, in some embodiments, the dielectric fill on a first sidewall of the super via can comprise a first material and the dielectric fill material on a second sidewall of the super via can comprise a second material. As shown, the super via can comprise two or more sidewall angles. Further, in some embodiments, a first sidewall of the super via can comprise a first set of sidewall angles and a second sidewall of the super via can comprise a second set of sidewall angles.

Figure 4:
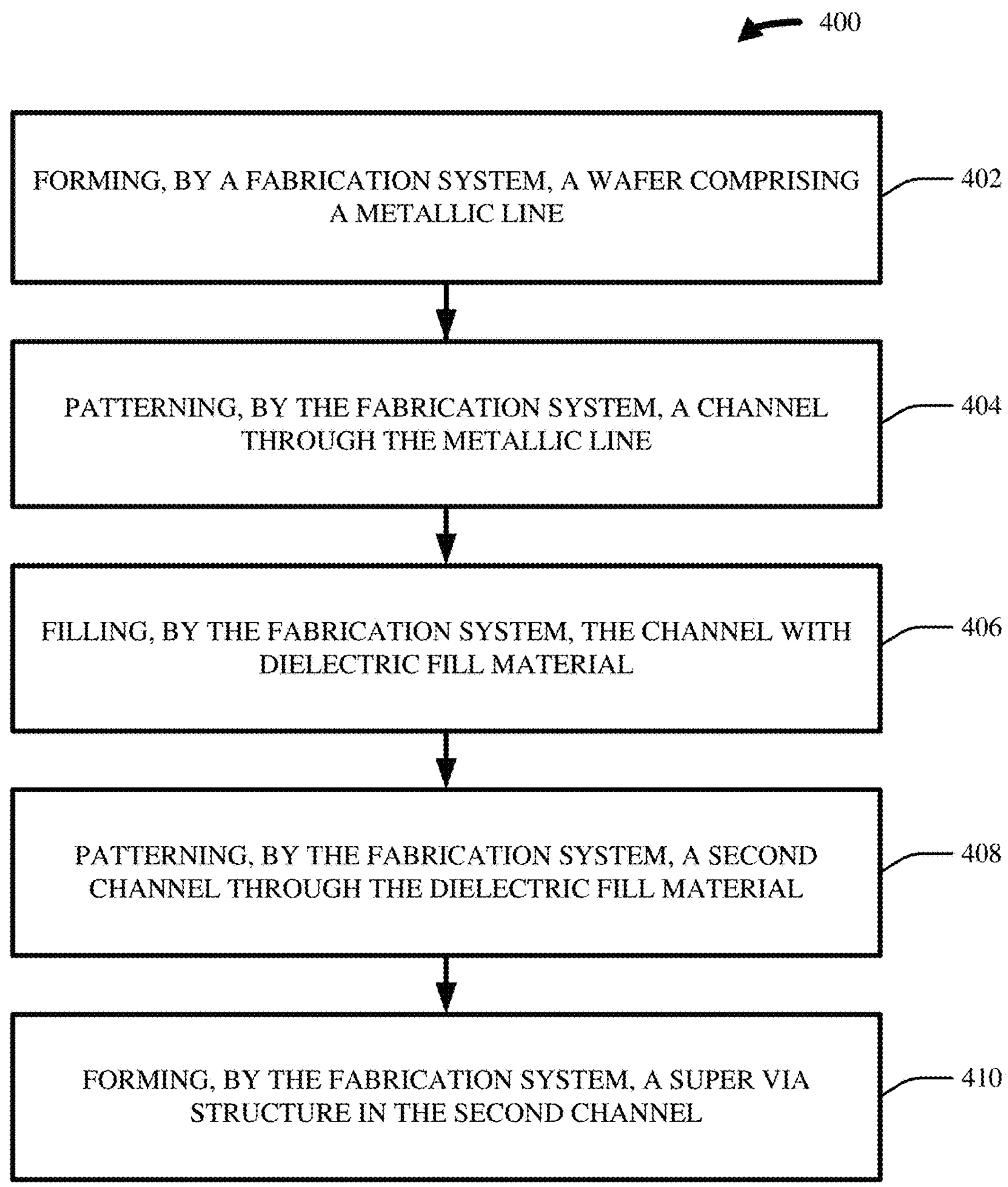
FIG. 4 illustrates a flow diagram of an example, non-limiting, method of fabrication for a super via device in accordance with one or more embodiments described herein.

FIG. 4 illustrates a flow diagram of an example, non-limiting, method of fabrication 400 for a transistor device in accordance with one or more embodiments described herein.

At 402, method 400 can comprise, forming, by a fabrication system, a wafer comprising a metallic line.

At 404, method 400 can comprise patterning, by the fabrication system, a channel through the metallic line. For example, based on the material composition of the metallic line, a wet etch or dry etch process can be utilized to etch through the metallic line.

At 406, method 400 can comprise filling, by the fabrication system, the channel with dielectric fill material. For example, a high-k dielectric material (e.g., a material with a dielectric constant greater than the dielectric constant of silicon dioxide) can be utilized to fill the channel. Examples of such materials include, but are not limited to, AlO, HfO or SiN.

At 408, method 400 can comprise patterning, by the fabrication system, a second channel through the dielectric fill material. In an embodiment, the second channel can comprise a width less than the width of the first channel. Accordingly, some dielectric fill material will remain on the sidewalls of the second channel.

At 410, method 400 can comprise forming, by the fabrication system, a super via structure in the second channel. For example, a metallization process can be utilized to deposit a metal within the second channel to form a super via. Furthermore, as some dielectric fill material remained on the sidewalls of the second channel, the super via will have dielectric fill material adjacent to its sidewalls, thereby insulating the super via from the metallic line. Additionally, the presence of the dielectric fill material prevents the center of the super via from bowing outwards, thus helping the super via maintain its shape.

Figure 5:
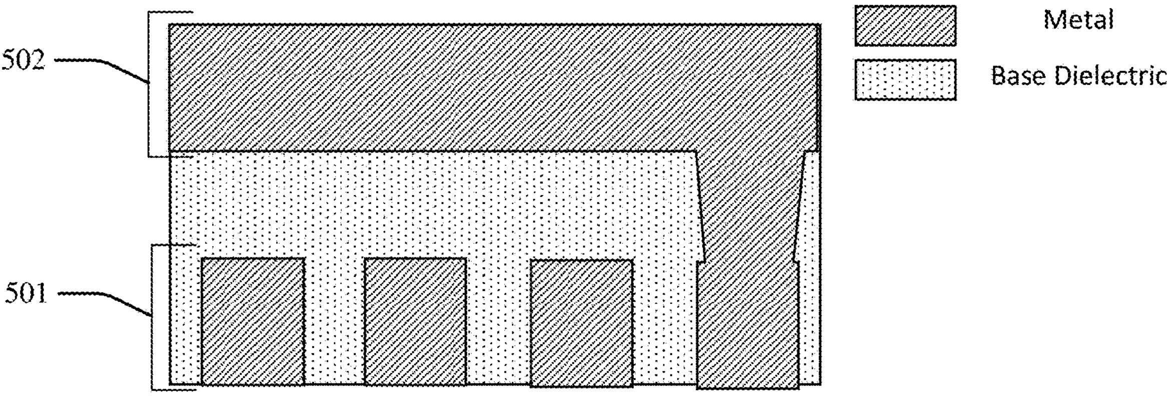
FIG. 5 illustrates an example, non-limiting, starting substrate for production of a super via device in accordance with one or more embodiments described herein.

FIG. 5 illustrates an example, non-limiting, starting substrate 500 for production of a super via device in accordance with one or more embodiments described herein.

As shown, substrate 500 comprises a first level of wiring 501 and a second level of wiring 502.

Figure 6:
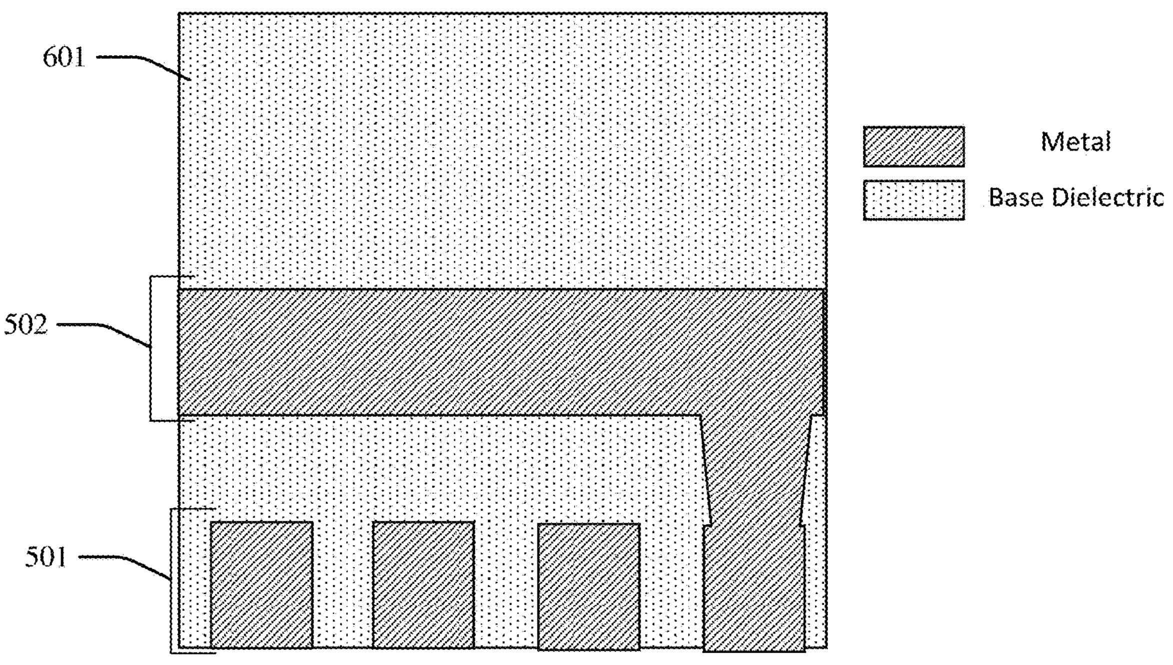
FIG. 6 illustrates an example, non-limiting, first stage of production of a super via device in accordance with one or more embodiments described herein.

FIG. 6 illustrates an example, non-limiting, first stage of production of a super via device in accordance with one or more embodiments described herein.

As shown, additional base dielectric material 601 can be deposited on top of the second level of wiring 502 to allow for the formation of a third level of wiring.

Figure 7:
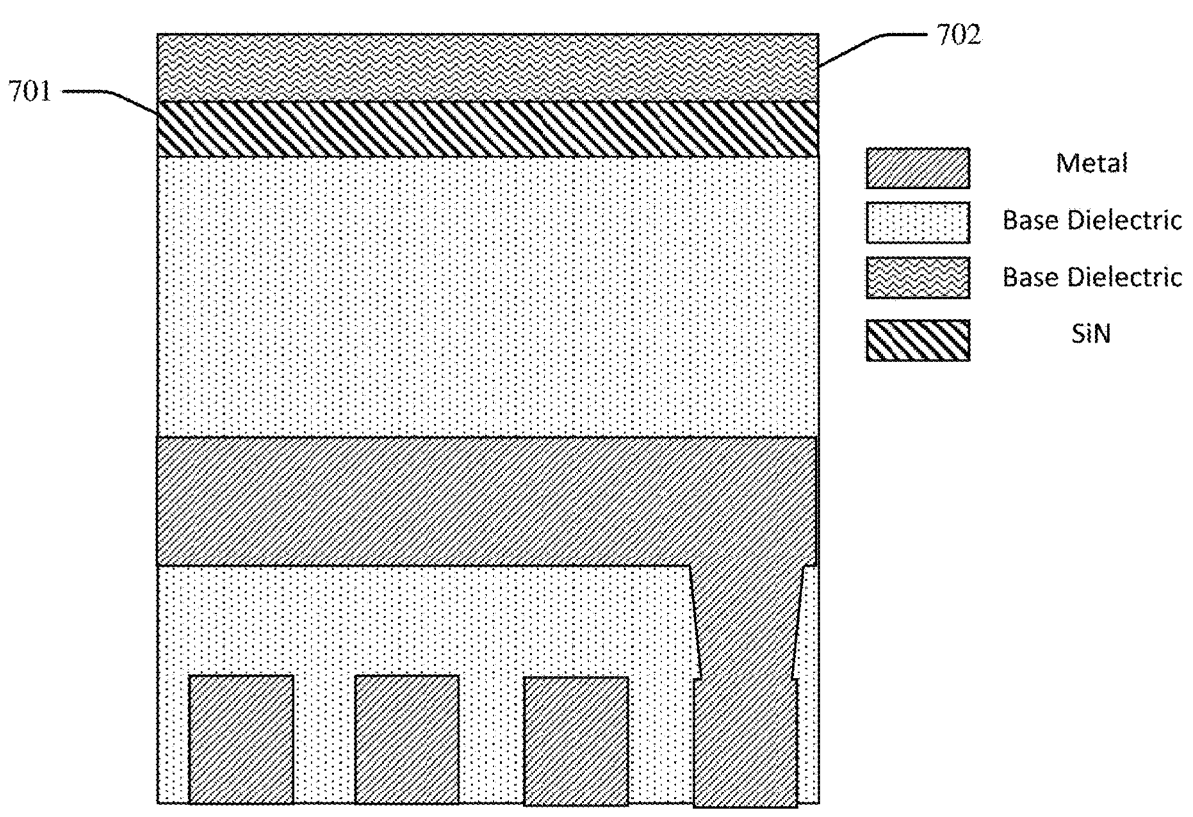
FIG. 7 illustrates an example, non-limiting, second stage of production of a super via device in accordance with one or more embodiments described herein.

FIG. 7 illustrates an example, non-limiting, second stage of production of a super via device in accordance with one or more embodiments described herein.

As shown, a sacrificial SiN layer 701 and a metallic layer 702 can be deposited on top of substrate 500.

Figure 8:
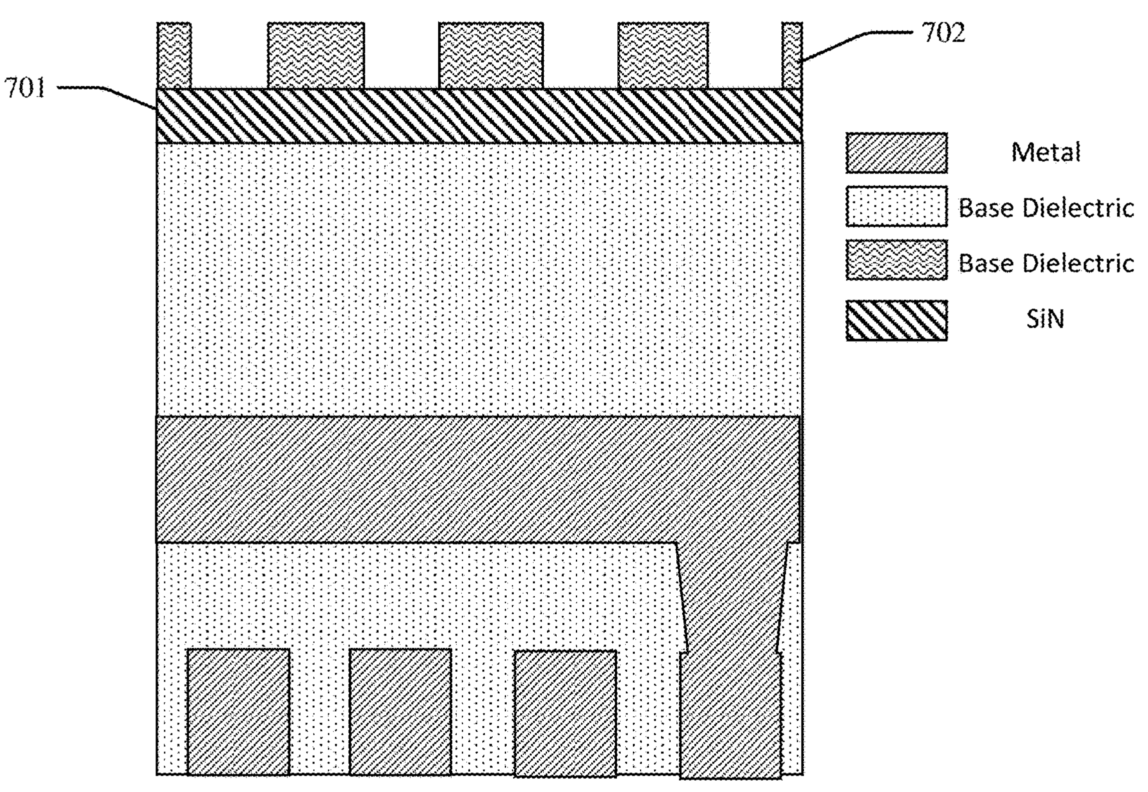
FIG. 8 illustrates an example, non-limiting, third stage of production of a super via device in accordance with one or more embodiments described herein.

FIG. 8 illustrates an example, non-limiting, third stage of production of a super via device in accordance with one or more embodiments described herein.

As shown, metallic layer 702 can be patterned and recessed to create channels. In later production steps, these channels can be utilized to mark where super vias and/or standard vias will be placed.

Figure 9:
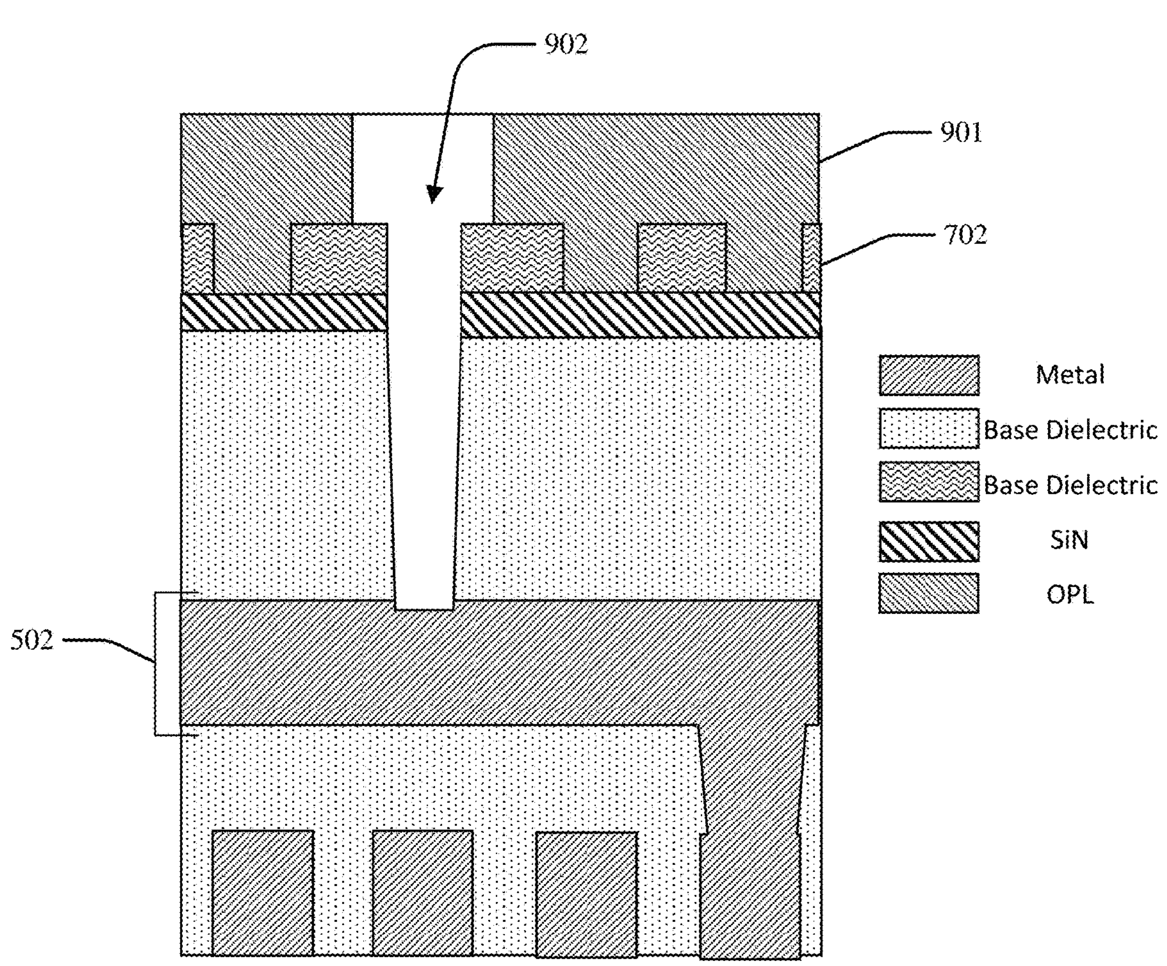
FIG. 9 illustrates an example, non-limiting, fourth stage of production of a super via device in accordance with one or more embodiments described herein.

FIG. 9 illustrates an example, non-limiting, fourth stage of production of a super via device in accordance with one or more embodiments described herein.

As shown, an organic planarization layer (OPL) 901 can be deposited onto substrate 500. A first channel 902 can then be etched/recessed down to the second level of wiring 502. In some embodiments, a first side of the first channel 902 can be etched first to produce a first set of sidewall angles and a second side of the first channel 902 can be then etched to produce a second set of sidewall angles.

Figure 10:
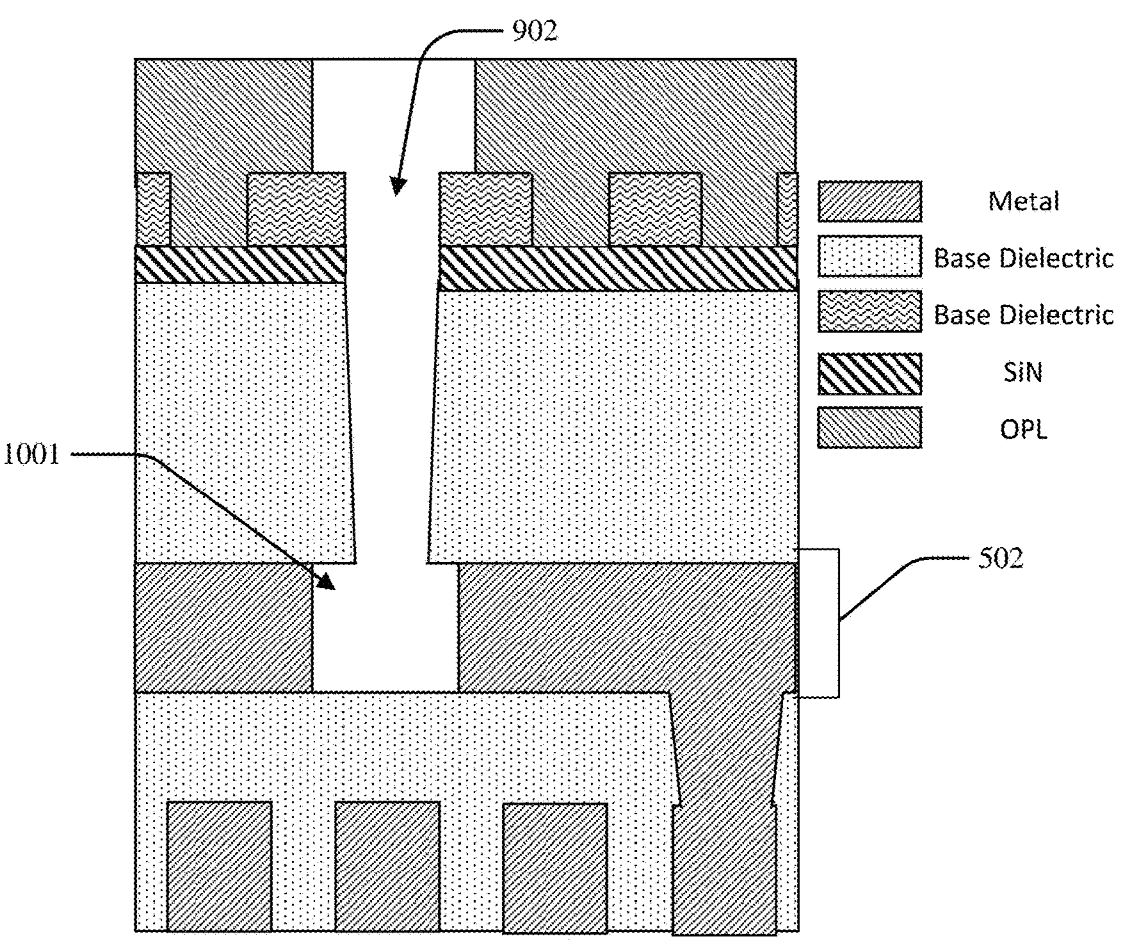
FIG. 10 illustrates an example, non-limiting, fifth stage of production of a super via device in accordance with one or more embodiments described herein.

FIG. 10 illustrates an example, non-limiting, fifth stage of production of a super via device in accordance with one or more embodiments described herein.

As shown, a second portion 1001 of the first channel 902 can be patterned, wherein the second portion 1001 extends the first channel 902 through the second level of wiring. It should further be appreciated that the second portion 1001 is wider than the first channel 902.

Figure 11:
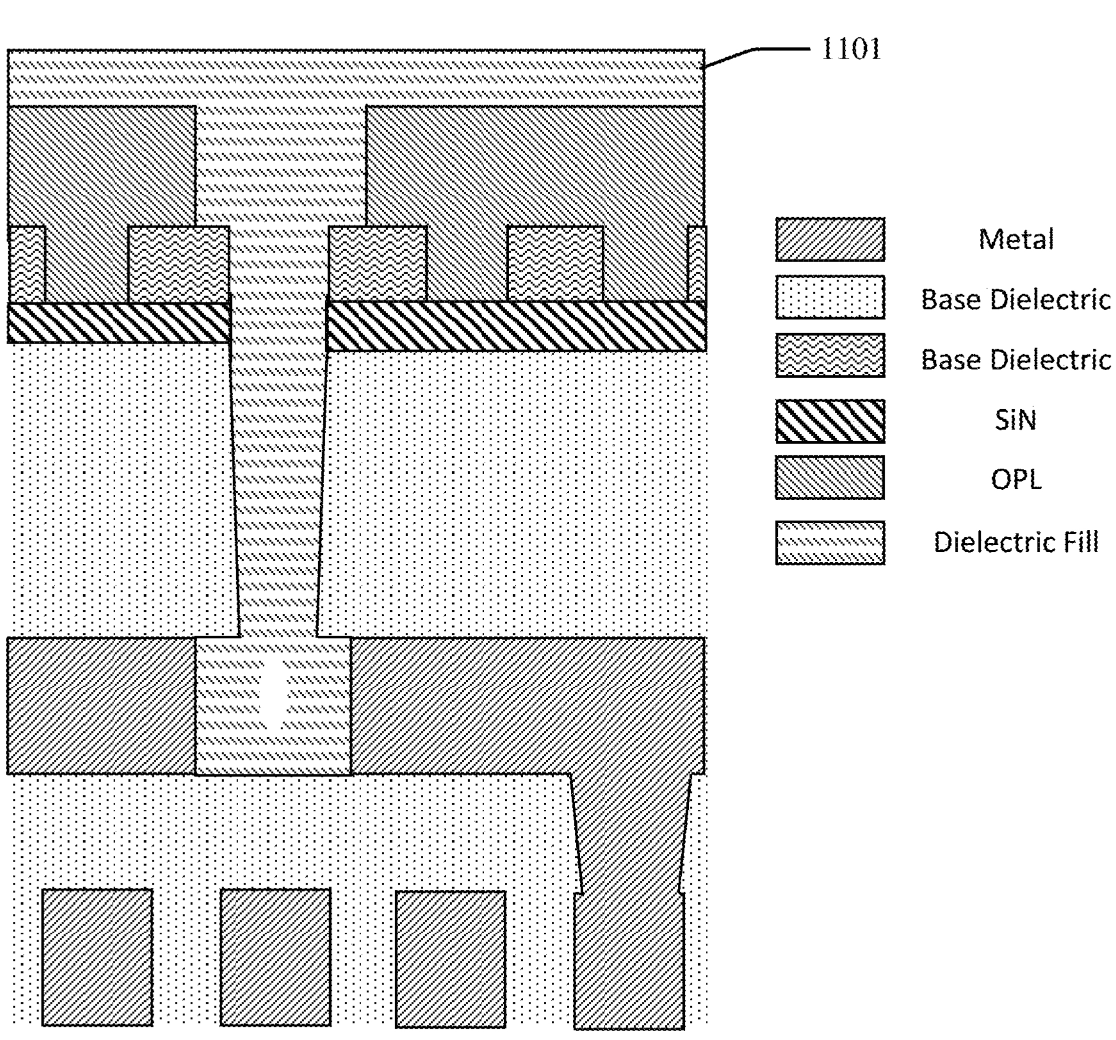
FIG. 11 illustrates an example, non-limiting, sixth stage of production of a super via device in accordance with one or more embodiments described herein.

FIG. 11 illustrates an example, non-limiting, sixth stage of production of a super via device in accordance with one or more embodiments described herein.

As shown, a dielectric fill material 1101 can be deposited onto substrate 500. As shown, the dielectric fill material 1101 will fill in the first channel 902. In an embodiment, the dielectric fill material 1101 can comprise at least one of AlO, SiN or HfOx. In some embodiments, multiple dielectric fill materials can be utilized. For example, a first material can be deposited along a first sidewall and a second material can be deposited along a second sidewall. In a further embodiment, the dielectric fill material 1101 can comprise any high-k dielectric material (e.g., a material comprising a dielectric constant greater than the dielectric constant of silicon dioxide.

Figure 12:
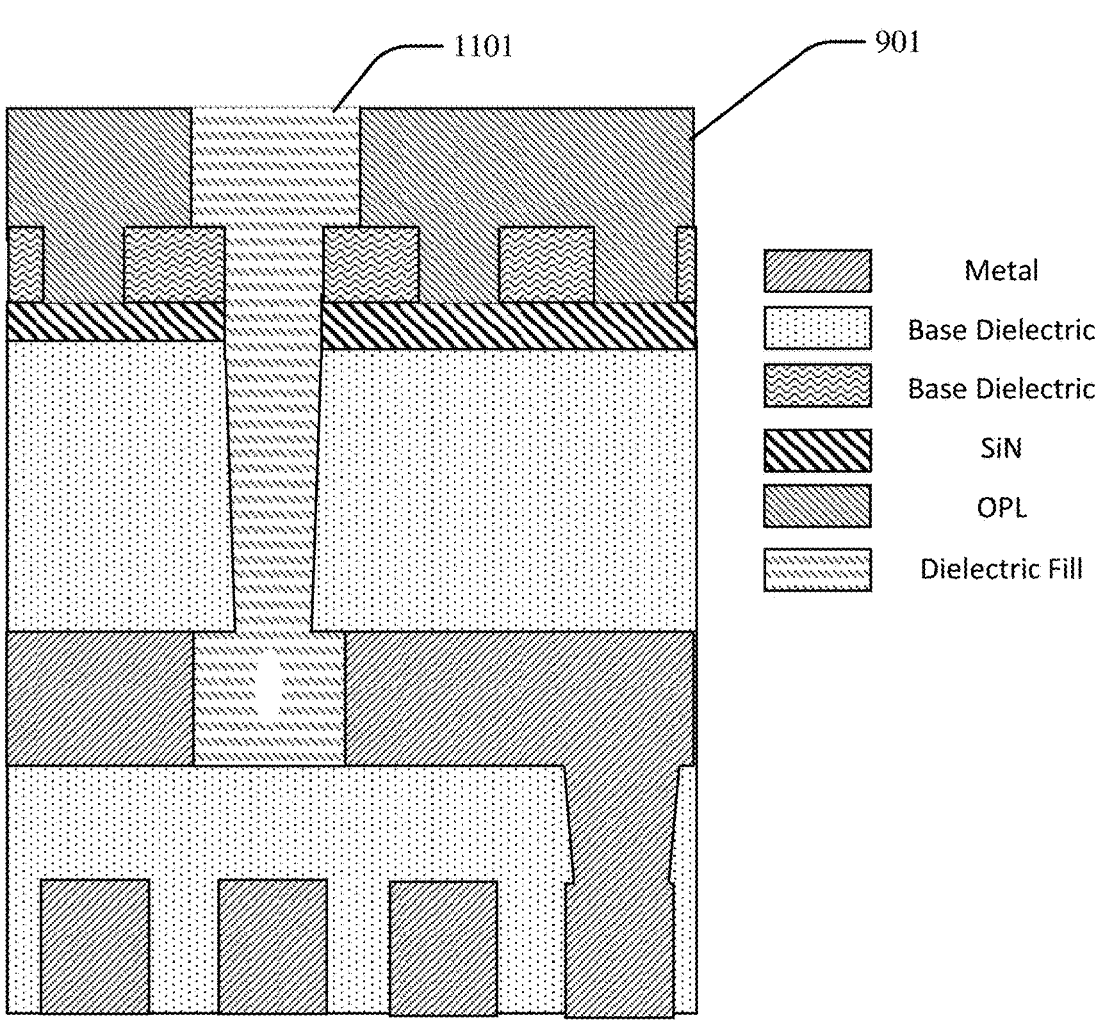
FIG. 12 illustrates an example, non-limiting, seventh stage of production of a super via device in accordance with one or more embodiments described herein.

FIG. 12 illustrates an example, non-limiting, seventh stage of production of a super via device in accordance with one or more embodiments described herein.

As shown, the dielectric fill material 1101 can be etched back to expose OPL layer 901.

Figure 13:
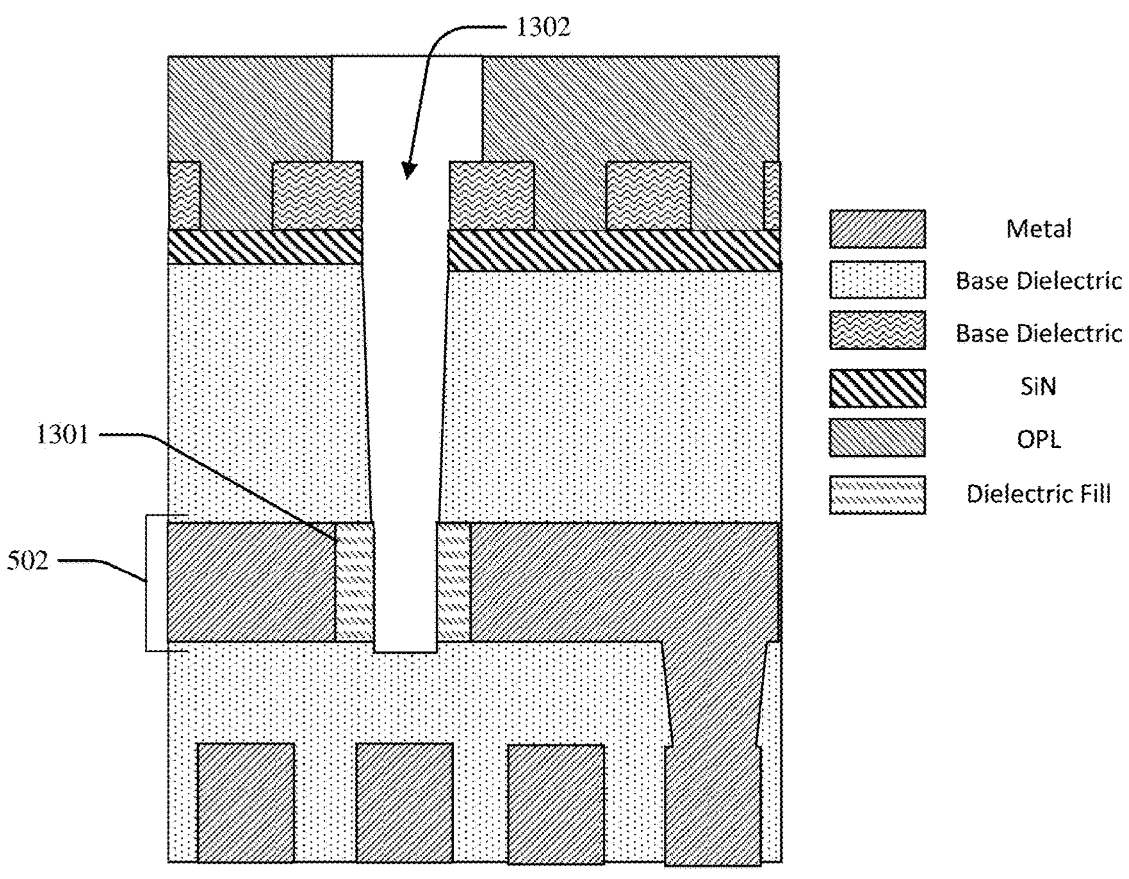
FIG. 13 illustrates an example, non-limiting, eight stage of production of a super via device in accordance with one or more embodiments describe herein.

FIG. 13 illustrates an example, non-limiting, eight stage of production of a super via device in accordance with one or more embodiments describe herein.

As shown, a second channel 1302 can be etched through the dielectric fill material 1101 to form a channel of a super via. It should be appreciated the second channel 1302 is narrower than that of the first channel 902. Accordingly, some dielectric fill material 1301 remains along the sidewalls of the second layer of wiring 502. As shown, this dielectric fill material 1301 can be self-aligned with the second level of wiring 502 (e.g., comprising the same height).

Figure 14:
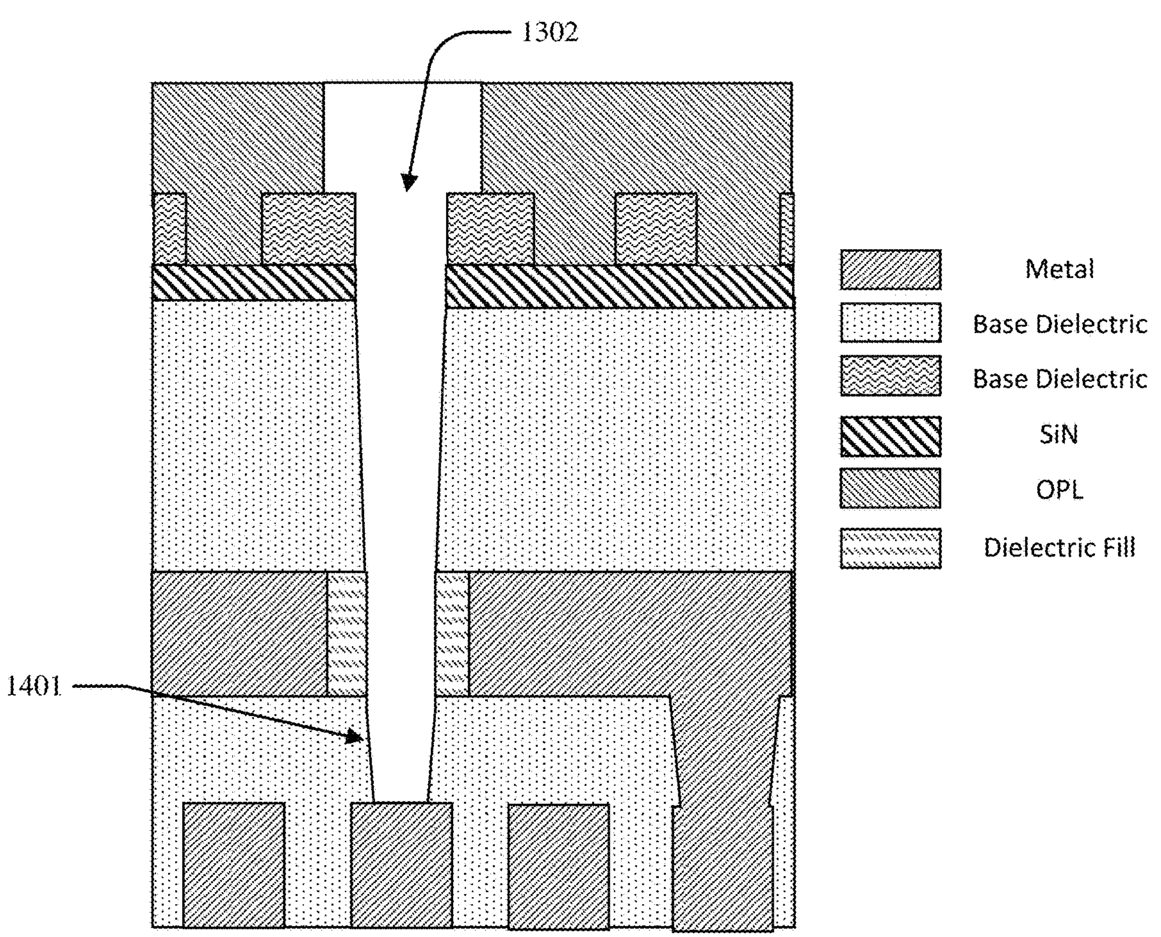
FIG. 14 illustrates an example, non-limiting, ninth stage of production of a super via device in accordance with one or more embodiments described herein.

FIG. 14 illustrates an example, non-limiting, ninth stage of production of a super via device in accordance with one or more embodiments described herein.

As shown, a second portion 1401 of the second channel 1302 can be patterned/etched to expose a portion of the first level of wiring 501. In an embodiment, the second portion 1401 can comprise a width less than the width of the second channel 1302.

Figure 15:
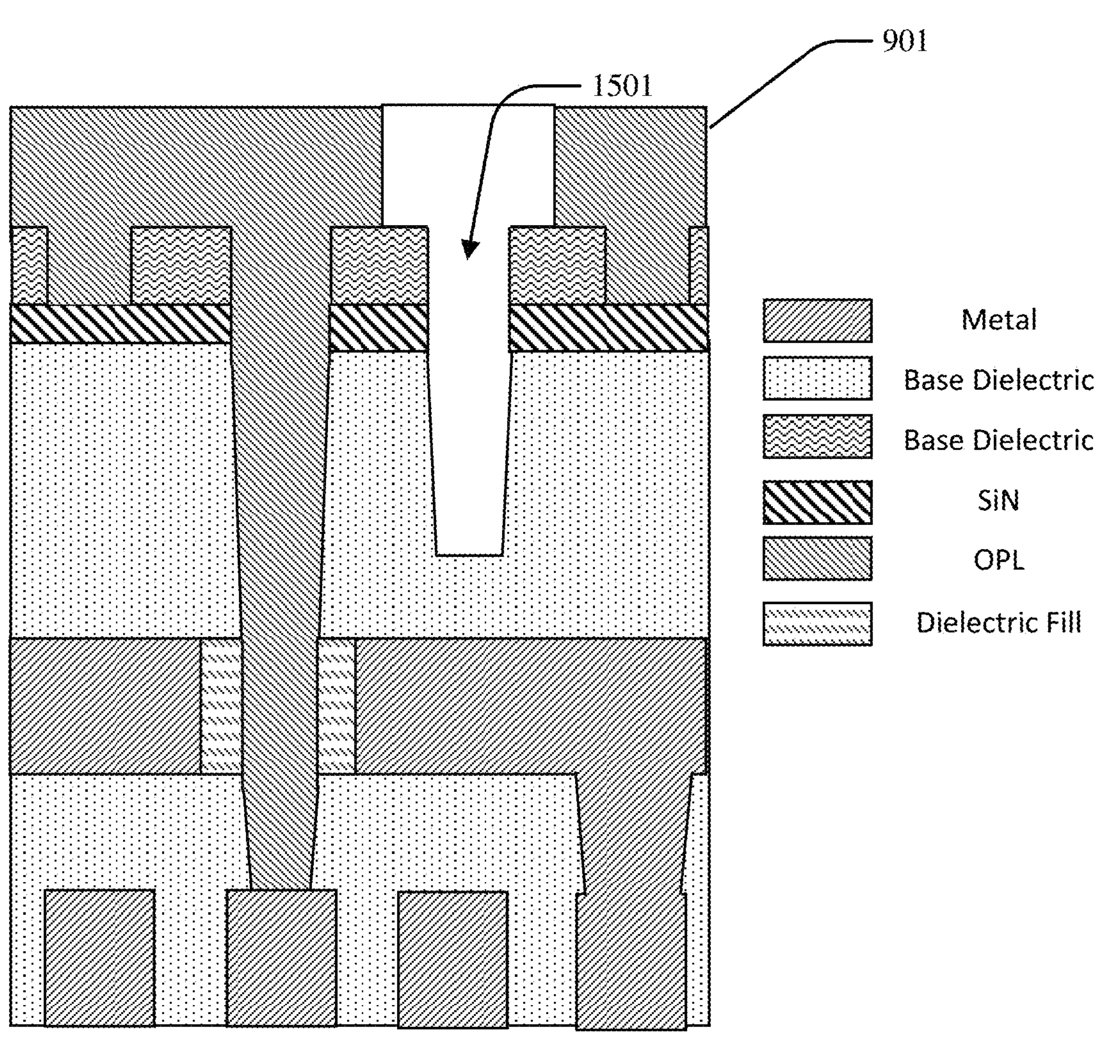
FIG. 15 illustrates an example, non-limiting, tenth stage of production of a super via device in accordance with one or more embodiments described herein.

FIG. 15 illustrates an example, non-limiting, tenth stage of production of a super via device in accordance with one or more embodiments described herein.

As shown, additional OPL 901 can be deposited to fill in the second channel 1302. This enables etching of a first portion of a standard via channel 1501, to enable formation of a standard via. It should be appreciated that while a single standard via channel is shown, channels for multiple standard vias may be patterned.

Figure 16:
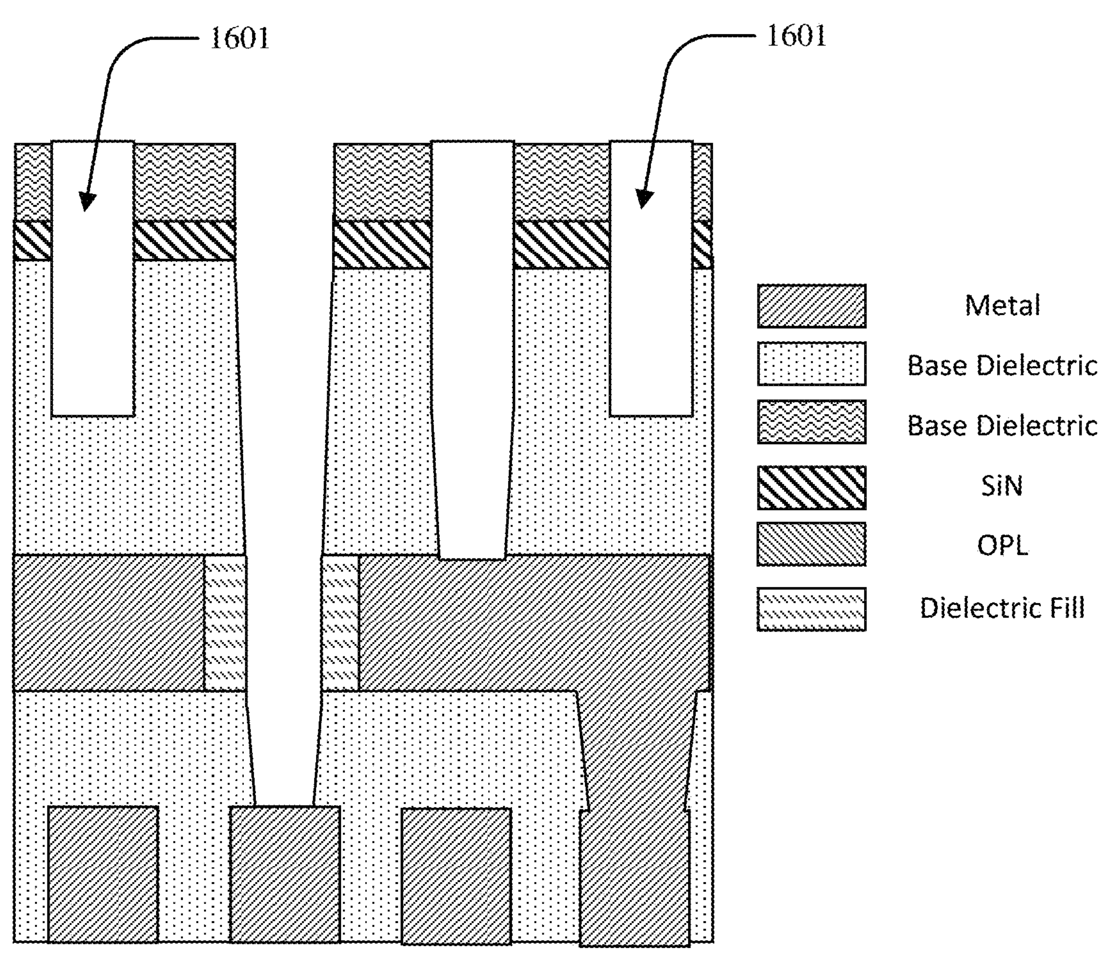
FIG. 16 illustrates an example, non-limiting, tenth stage of production of a super via device in accordance with one or more embodiments described herein.

FIG. 16 illustrates an example, non-limiting, tenth stage of production of a super via device in accordance with one or more embodiments described herein.

As shown, OPL 901 can be removed and one or more channels 1601 can be patterned to enable formation of a third level of wiring.

Figure 17:
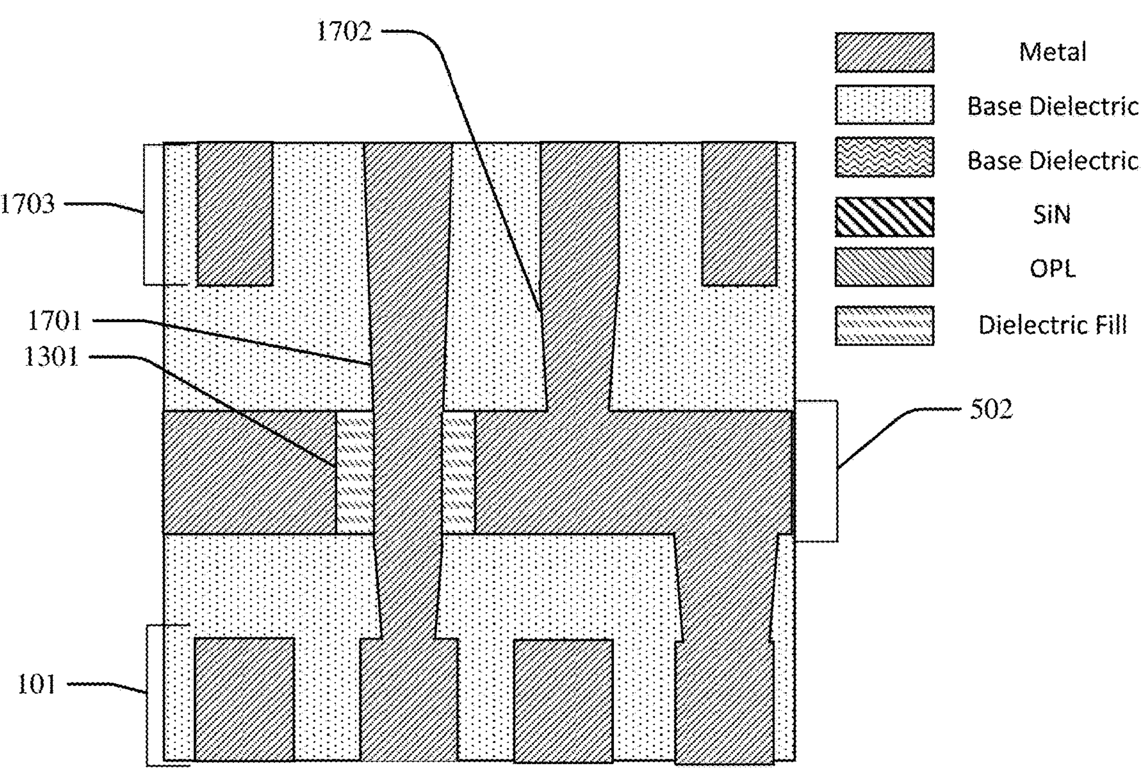
FIG. 17 illustrates an example, non-limiting, eleventh stage of production of a super via device in accordance with one or more embodiments described herein.

FIG. 17 illustrates an example, non-limiting, eleventh stage of production of a transistor device in accordance with one or more embodiments described herein.

As shown, standard via channel 1501, second channel 1302, and the one or more channels for the third level of wiring can be filled in by a metallization process to respectively form a skip via 1701, a standard via 1702 and a third level of wiring 1703. As shown, skip via 1701 connects the third level of wiring 1703 to the first level of wiring 501 and the standard via 1702 connects the third level of wiring 1703 to the second level of wiring 502. As show, the dielectric fill material 1301 insulates the side walls of the skip via 1701 from the second level of wiring 502, preventing shorts in the skip via 1701. Furthermore, due to the placement of the dielectric fill material 1301, the skip via 1701 retains its shape during formation and does not expand outwards toward the second level of wiring 502. Additionally, as shown, skip via 1701 comprises multiple sidewall angles.

Figure 18:
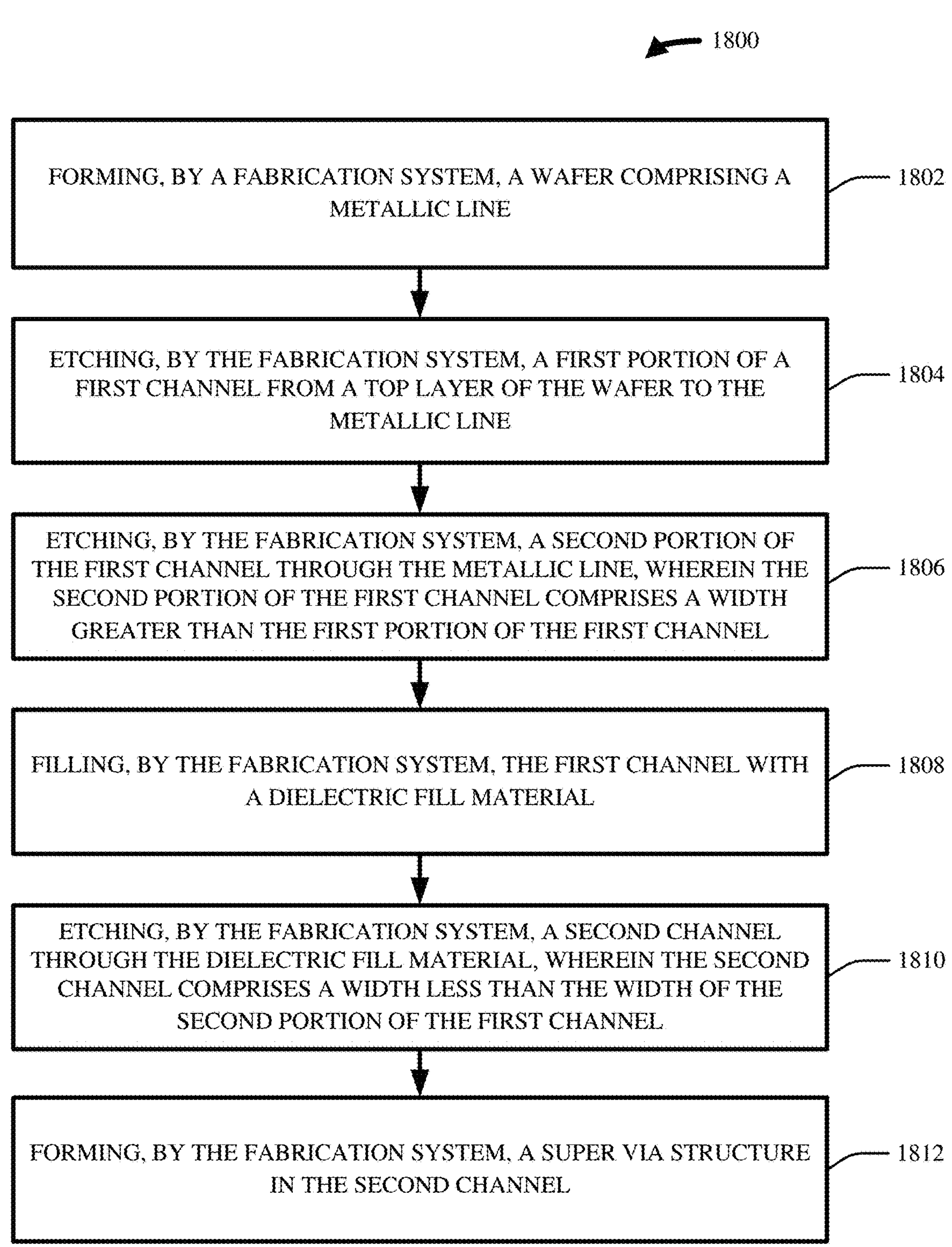
FIG. 18 illustrates a flow diagram of an example, non-limiting, method of fabrication for a super via device in accordance with one or more embodiments described herein.

FIG. 18 illustrates a flow diagram of an example, non-limiting, method of fabrication 1800 for a transistor device in accordance with one or more embodiments described herein.

At 1802, method 1800 can comprise forming, by fabrication system, a wafer comprising a metallic line.

At 1804, method 1800 can comprise etching, by the fabrication system, a first portion of a first channel from a top layer of the wafer to the metallic line.

At 1806, method 1800 can comprise etching, by the fabrication system a second portion of the first channel through the metallic line, wherein the second portion of the first channel comprises a width greater than the first portion of the first channel. As the second portion is wider than the first portion, this allows for the placement of dielectric fill material between a super via and adjacent metallic lines.

At 1808, method 1800 can comprise filing, by the fabrication system, the first channel with a dielectric fill material. For example, materials such as AlO, HfO, SiN or another high-k material can be utilized.

At 1810, method 1800 can comprise etching, by the fabrication system, a second channel through the dielectric fill material, wherein the second channel comprises a width less than the width of the second portion of the first channel. For example, as the second channel is narrower than the first channel, not all of the dielectric fill material is removed, thereby leaving a dielectric fill material along the sidewalls of the metallic line.

At 1812, method 1800 can comprise forming, by the fabrication system, a super via structure in the second channel. For example, a metallization process can be utilized to deposit metal within the second channel. Due to the presence of the dielectric fill material, the super via will be insulated from the metallic line, thus preventing shorts. Furthermore, the presence of the dielectric fill material prevents the center of the super via from bowing outwards, thus helping the super via maintain its shape.

An advantage of such methods, devices and/or systems is that the enable super vias with decreased chance of shorting, thus improving super via performance. For example, by depositing dielectric fill material along the sidewalls of a super via adjacent to intermediate metallic lines, the super via is insulated from the metallic line, thus decreasing the risk of shorts between the super via and the metallic line. Furthermore, the dielectric fill material prevents bowing out of the middle of the super via during fabrication, thus helping ensure the super via maintains its intended shape. A practical application of the above-described devices is that they offer decreased risk of shorting of super vias, thus improving performance.

What is claimed is:

1. A super via device comprising:

a super via structure comprising a first sidewall and a second sidewall, wherein the first sidewall comprises a first set of two or more sidewall angles and the second sidewall comprises a second set of two or more sidewall angles;

a metallic line; and a dielectric fill material located between sidewalls of the super via structure and the metallic line.

2. The super via device of claim 1, wherein the dielectric fill material comprises at least one of AlO, HfO, SiN.

3. The super via device of claim 1, wherein the super via structure comprises at least one of Cu, Co, Ru, W, Rh or Ir.

4. The super via device of claim 1, wherein the super via structure comprises two or more sidewall angles.

5. The super via device of claim 1, wherein the super via structure comprises a first sidewall and a second sidewall, and wherein the dielectric fill material comprises a first fill material between the first sidewall and the metallic line and a second fill material between the second sidewall and the metallic line.

6. The super via device of claim 1, wherein the dielectric fill material comprises a dielectric constant greater than the dielectric constant of silicon dioxide.

7. A method for fabricating a semiconductor device by a fabrication system, the method comprising:

- forming, by the fabrication system, a wafer comprising a metallic line;
- patterning, by the fabrication system, a channel through the metallic line;
- filling, by the fabrication system, the channel with a dielectric fill material;
- patterning, by the fabrication system, a second channel through the dielectric fill material; and
- forming, by the fabrication system, a super via structure in the second channel wherein the super via structure comprises a first sidewall and a second sidewall, wherein the first sidewall comprises a first set of two or more sidewall angles and the second sidewall comprises a second set of two or more sidewall angles.

8. The method of claim 7, wherein the dielectric fill material comprises at least one of AlOx, HfOx, SiN.

9. The method of claim 7, wherein the super via structure comprises at least one of Cu, Co, Ru, W, Rh or Ir.

10. The method of claim 7, wherein the super via structure comprises two or more sidewall angles.

11. The method of claim 7, wherein the super via structure comprises a first sidewall and a second sidewall, and wherein the dielectric fill material comprises a first fill material between the first sidewall and the metallic line and a second fill material between the second sidewall and the metallic line.

12. The method of claim 7, wherein the dielectric fill material comprises a dielectric constant greater than the dielectric constant of silicon dioxide.

13. A method for fabricating a semiconductor device by a fabrication system, the method comprising:

- forming, by the fabrication system, a wafer comprising a metallic line;
- etching, by the fabrication system, a first portion of a first channel from a top layer of the wafer to the metallic line;
- etching, by the fabrication system, a second portion of the first channel through the metallic line, wherein the second portion of the first channel comprises a width greater than the first portion of the first channel;
- filling, by the fabrication system, the first channel with a dielectric fill material;
- etching, by the fabrication system, a second channel through the dielectric fill material, wherein the second channel comprises a width less than the width of the second portion of the first channel; and
- forming, by the fabrication system, a super via structure in the second channel, wherein the super via structure comprises a first sidewall and a second sidewall, wherein the first sidewall comprises a first set of two or more sidewall angles and the second sidewall comprises a second set of two or more sidewall angles.

14. The method of claim 13, wherein the dielectric fill material comprises at least one of AlOx, HfOx, SiN.

15. The method of claim 13, wherein the super via structure comprises at least one of Cu, Co, Ru, W, Rh or Ir.

16. The method of claim 13, wherein the super via structure comprises two or more sidewall angles.

17. The method of claim 15, wherein the dielectric fill material comprises a dielectric constant greater than the dielectric constant of silicon dioxide.

* * * * *